(12) United States Patent
Funk et al.

(10) Patent No.: US 9,859,785 B2
(45) Date of Patent: Jan. 2, 2018

(54) DEVICE AND METHOD FOR REDUCING SWITCHING LOSSES IN POWER TRANSISTORS

(71) Applicant: Robert Bosch GmbH, Stuttgart (DE)

(72) Inventors: Tobias Funk, Dornstetten (DE); Juergen Wittmann, Wannweil (DE); Bernhard Wicht, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 15/128,494

(22) PCT Filed: Feb. 13, 2015

(86) PCT No.: PCT/EP2015/053083
§ 371 (c)(1),
(2) Date: Sep. 23, 2016

(87) PCT Pub. No.: WO2015/144355
PCT Pub. Date: Oct. 1, 2015

(65) Prior Publication Data
US 2017/0110957 A1    Apr. 20, 2017

(30) Foreign Application Priority Data

Mar. 28, 2014   (DE) .................. 10 2014 205 844

(51) Int. Cl.
*G05F 1/00*       (2006.01)
*H02M 1/088*     (2006.01)
(Continued)

(52) U.S. Cl.
CPC ........... *H02M 1/088* (2013.01); *H02M 3/158* (2013.01); *H02M 2001/0054* (2013.01)

(58) Field of Classification Search
CPC .... H02M 3/1582; H02M 1/088; H02M 3/156; H02M 3/158; H02M 2001/0054; H02M 2001/0058; H02M 2001/0022
(Continued)

(56) References Cited

U.S. PATENT DOCUMENTS 5,481,178 A * 1/1996 Wilcox ................. H02M 3/156
                                                     323/224
5,532,919 A * 7/1996 Gegner ................. H02M 3/158
                                                     363/124
(Continued)

FOREIGN PATENT DOCUMENTS

EP    0767529 A2    4/1997
EP    2221972 A2    8/2010
WO    9531853 A1   11/1995

OTHER PUBLICATIONS

International Search Report dated Apr. 17, 2015, of the corresponding International Application PCT/EP/2015/053083, filed on Feb. 13, 2015.

*Primary Examiner* — Alex Torres-Rivera
(74) *Attorney, Agent, or Firm* — Norton Rose Fulbright US LLP; Gerard Messina

(57) ABSTRACT

A device including a first and second monitoring unit, the first monitoring unit detecting a first voltage potential and the second monitoring unit detecting a second voltage potential, the monitoring units comparing the first voltage potential and the second voltage potential to the value of the supply voltage and activate a control unit as a function of the comparisons, the control unit determining a switching point in time of a second power transistor, and an arrangement being present which generates current when the second power transistor is being switched on, the current changing the first voltage potential, and the control unit activates a first power transistor when the first voltage potential has the (Continued)

same value as the supply voltage, so that the first power transistor is de-energized.

7 Claims, 4 Drawing Sheets

(51) Int. Cl.
*H02M 3/158* (2006.01)
*H02M 1/00* (2006.01)

(58) Field of Classification Search
USPC ....... 323/259, 282, 284, 285, 299, 300, 301, 323/303, 344
See application file for complete search history.

(56) References Cited

U.S. PATENT DOCUMENTS

| | | | |
|---|---|---|---|
| 5,594,635 A | 1/1997 | Gegner | |
| 5,847,554 A * | 12/1998 | Wilcox | H02M 3/1588 323/282 |
| 6,341,078 B1 * | 1/2002 | Miller | H02M 7/5387 363/132 |
| 7,495,423 B1 * | 2/2009 | Knight | H02M 3/1588 323/259 |
| 9,337,741 B2 * | 5/2016 | Fan | H02M 3/33523 |
| 2010/0237845 A1 * | 9/2010 | Scaldaferri | H02J 7/0052 323/299 |
| 2012/0223667 A1 | 9/2012 | Wang et al. | |
| 2014/0077790 A1 * | 3/2014 | Sohma | H02M 3/1588 323/313 |

* cited by examiner

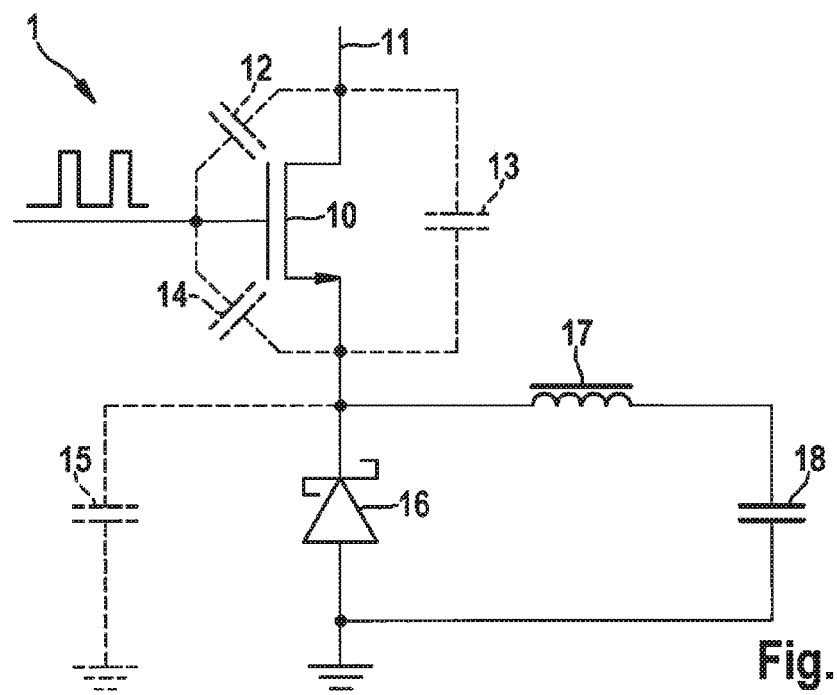
Fig. 1
(Related Art)
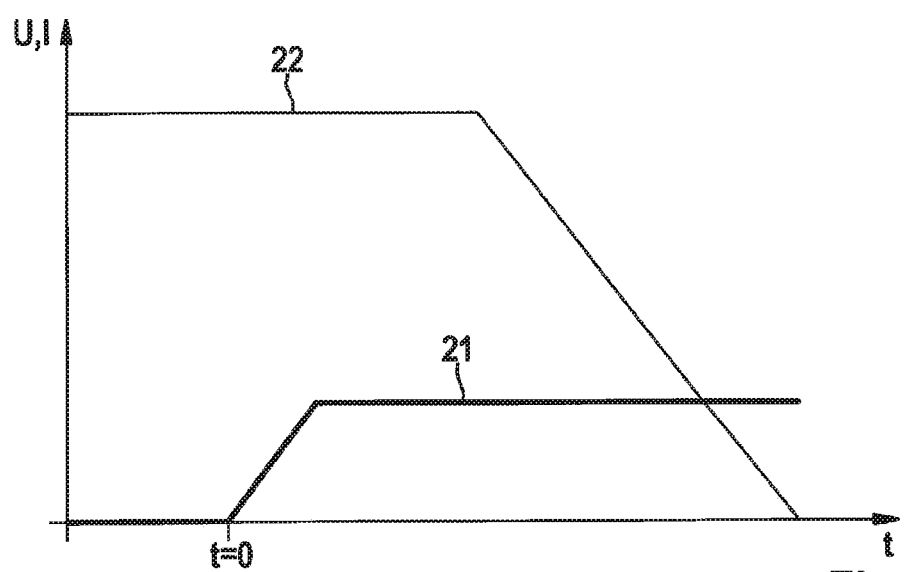
(Related Art) Fig. 2

DEVICE AND METHOD FOR REDUCING SWITCHING LOSSES IN POWER TRANSISTORS

BACKGROUND INFORMATION

The present invention relates to a device and to a method for reducing switching losses in power transistors. Every time a power transistor is switched, which acts as a power switch, for example, the charge of the parasitic capacitances of the output stage must be resistively reversed. This results in high power losses.

Conventionally, a step-down converter may be configured with an oscillating circuit made up of a capacitor, which is connected in parallel between the drain and the source of the power transistor, and a coil, which is connected in series to the power transistor. With the aid of the oscillating circuit, the power transistor may be de-energized. The disadvantage here is that the working range of the step-down converter is limited by the serial coil present in the main path of the load current. If the step-down converter leaves the optimal working point, de-energization is no longer possible, and the efficiency of the power transistor decreases considerably.

It is furthermore conventional to connect an auxiliary circuit made up of a power switch, an inductor, and a Schottky diode in parallel to the output stage. A capacitor is connected in parallel to the drain-source terminal of the power transistor of the step-down converter. The power transistor may be de-energized with the aid of the auxiliary circuit. The disadvantage here is that the switching speed is slow due to the parallel capacitance, and the auxiliary circuit requires a higher driver capability. Moreover, only the power transistor of the step-down converter is de-energizable, not, however, the power transistor of the auxiliary circuit, or only within a very limited working range. The power loss of the system is thus not decreased, and both the Schottky diode and the power transistor of the auxiliary circuit have to be dimensioned to be identical to the output stage.

The object of the present invention is to minimize the switching losses of a power transistor.

SUMMARY

According to the present invention, the device and the method include a first power transistor and a second power transistor. The first power transistor includes a drain terminal, which is connected to a supply voltage. A source terminal of the first power transistor is connected to a first voltage potential. A drain terminal of the second power transistor is connected to the drain terminal of the first power transistor. A source terminal of the second power transistor is connected to a second voltage potential. The two voltage potentials are each connected to a monitoring unit. These monitoring units detect the particular voltage potential and compare the particular voltage potential to a value of the supply voltage. A control unit is activated as a function of the comparisons of the monitoring units. This control unit acts, for example, as a switching logic circuit for the power transistors. The control unit determines a switching point in time of the second power transistor. A means which generates a current when the second power transistor is switched on is provided downstream from the second voltage potential. This current changes the first voltage potential. The control unit activates the first power transistor when the first voltage potential has the same value as the supply voltage, so that the first power transistor is de-energized.

An advantage here is that the switching losses of the first power transistor are minimal.

In one refinement, the means includes a capacitor and a coil, which generate the time-delayed current. The capacitor is connected to the second voltage potential and ground. The coil is connected to the first voltage potential and the second voltage potential.

An advantage here is that the working range of the device is increased, so that it is possible to de-energize the first power transistor even when the optimal working point is left, and the efficiency of the device is not decreased.

In one further embodiment, the monitoring units each include a comparator, which carries out the comparison of the first and second voltage potentials to the value of the supply voltage.

In one refinement, the monitoring units include a means which determines a respective maximum of the first and second voltage potentials. The switching points in time of the first and of the second power transistors are determined by the control unit as a function of the particular maximum.

An advantage here is that the monitoring units are configured using simple elements.

In one further embodiment, the first and the second voltage potentials are monitored by a single monitoring unit.

The advantage here is that the size of the device is reduced.

Further advantages are derived from the description below of exemplary embodiments.

BRIEF DESCRIPTION OF THE DRAWINGS

The present invention is described hereafter based on preferred specific embodiments and figures.

FIG. 1 shows an output stage of a step-down converter from the related art.

FIG. 2 shows a voltage curve and a current curve when a power transistor from the related art is switched on.

DETAILED DESCRIPTION OF EXAMPLE EMBODIMENTS

Figure 3:
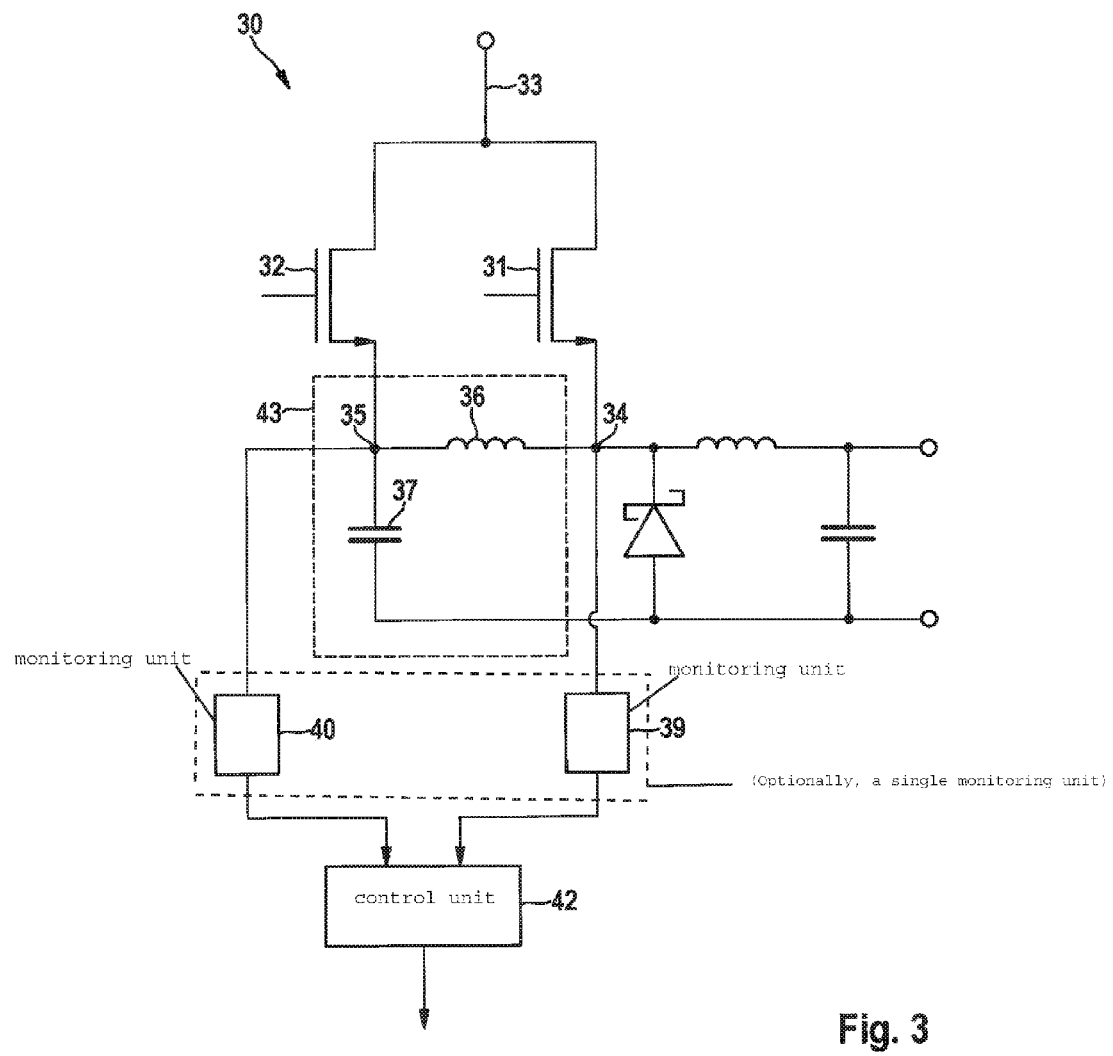
FIG. 3 shows a device according to the present invention, which is being de-energized.

FIG. 1 shows an output stage 1 of a step-down converter from the related art. The output stage includes a power transistor 10. Power transistor 10 is connected on the drain side to a supply voltage 11. FIG. 1 furthermore shows coil 17 and capacitor 18 of the output filter as components. A Schottky diode 16 is provided in parallel to the output filter. The parasitic capacitances present during operation of the output stage are dotted in FIG. 1. Every time the power transistor is switched on, which acts as a power switch, the charge of all parasitic capacitances of the output stage must be resistively reversed. The charges of drain-source capacitance 13 and node capacitance 15 are reversed with the aid of an input resistance of power transistor 10 and cause high power losses of the output stage.

FIG. 2 shows the associated voltage and current curves when the power transistor is being switched on. When the power transistor is being switched on (t=0), current 21 rises drastically and reverses the charge of the parasitic capacitances of the output stage. Since drain-source voltage 22 of the power transistor is not minimal at the switch-on point in time, high power losses arise.

FIG. 3 shows a device 30 according to the present invention, for example a step-down converter which is able to be de-energized. The working frequency of the device is in the MHz range, preferably in a range of up to 25 MHz. Step-down converter 30 includes a first power transistor 31, which is assigned to the output stage of the step-down converter. First power transistor 31 is connected to supply voltage 33 and a first voltage potential 34 or a first node. A drain terminal of first power transistor 31 is connected to an auxiliary switching circuit, which includes a second power transistor 32, a capacitor 37 and a coil 36. Second power transistor 32 is connected to supply voltage 33 and a second voltage potential 35 or a second node. Capacitor 33 is connected to second voltage potential 35 and to ground, and coil 34 is connected to the first and second voltage potentials. First voltage potential 34 and second voltage potential 35 are each connected to a monitoring unit 39, 40, which detect the voltage potentials and compare these to the value of the supply voltage. Monitoring units 39, 40 are connected to a control unit 42, which serves as an activation logic circuit of the power transistors and determines the switching points in time of the power transistors as a function of the comparisons.

Figure 4:
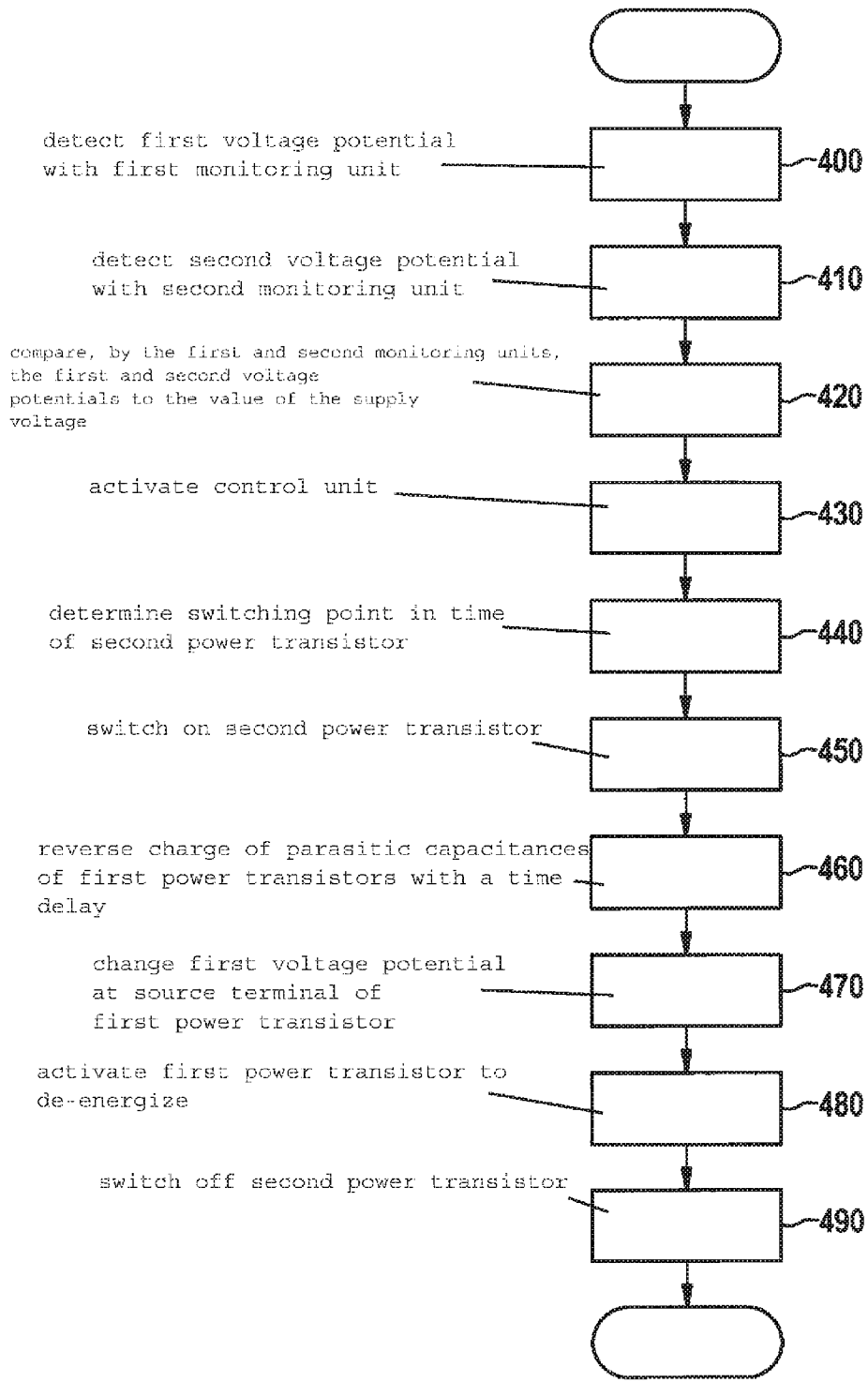
FIG. 4 shows a method for de-energizing the power transistor.

FIG. 4 shows a method for reducing switching losses of a device including power transistors, for example a step-down converter. The method starts with step 400, in which a first voltage potential 34 is detected with the aid of a first monitoring unit 39. In a subsequent step 410, a second voltage potential is detected with the aid of a second monitoring unit 40. In a subsequent step 420, the voltage potentials are compared in the particular monitoring unit 39, 40 to the value of the supply voltage. In a subsequent step 430, a control unit 42 is activated. If second voltage potential 35 coincides with the value of the supply voltage, the switching point in time of the second power transistor is determined in a subsequent step 440. In a subsequent step 450, the second power transistor is switched on. A current is thereby generated in the oscillating circuit which is made up of capacitor 37 and coil 36 and which, in a subsequent step 460, reverses the charge of the parasitic capacitances of the first power transistors with a time delay. In a subsequent step 470, the first voltage potential at the source terminal of the first power transistor is changed. If the first voltage potential has the same value as the supply voltage, the control unit activates the first power transistor in a subsequent step 480, so that the same is de-energized. In an optional step 490, second power transistor 32 is switched off. Due to the oscillating circuit, second voltage potential 35 or second node begins to oscillate. After a period, the second voltage potential reaches the supply voltage again, and the second power transistor may also be de-energized.

Figure 5:
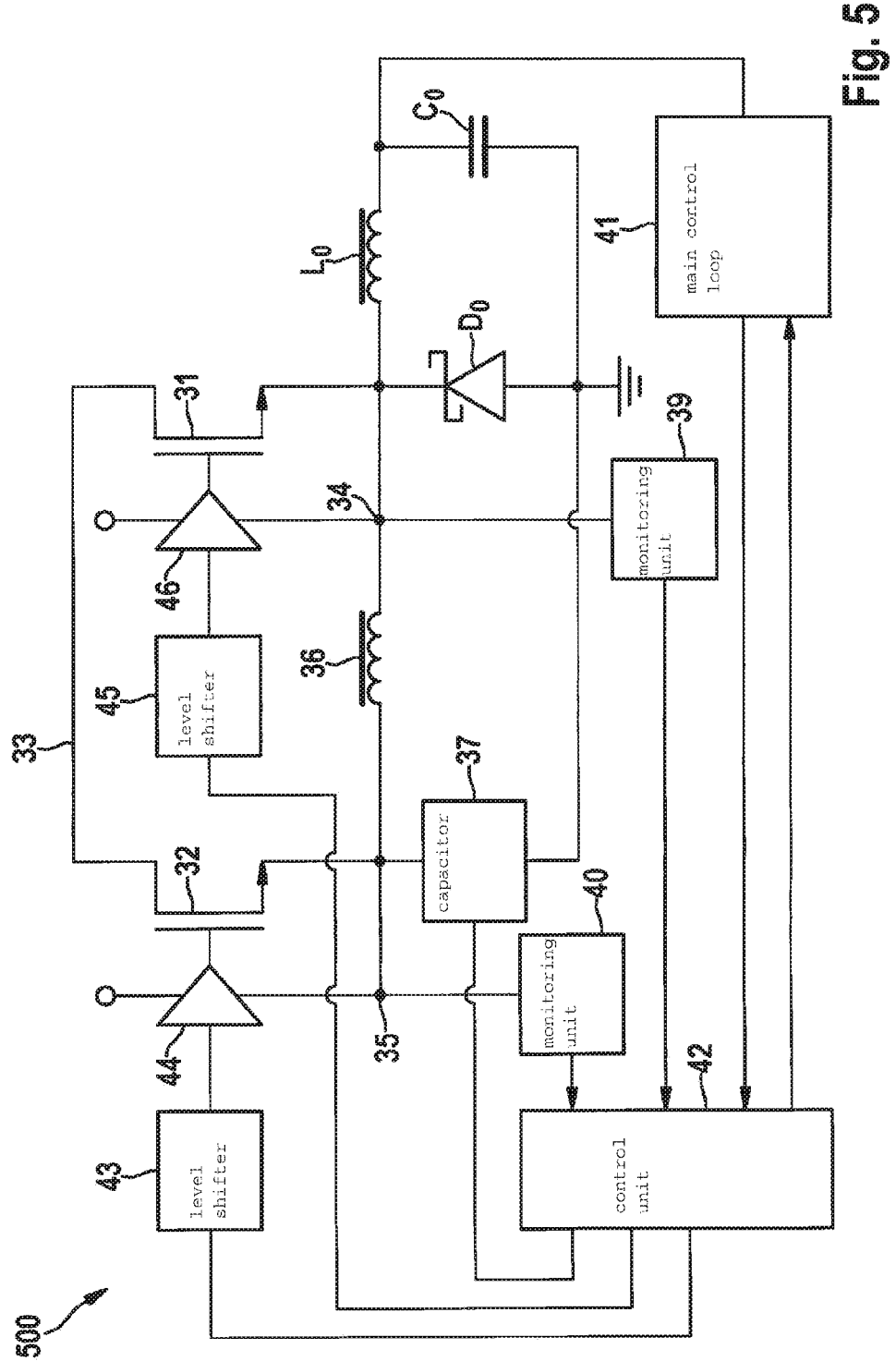
FIG. 5 shows a step-down converter including a control loop.

FIG. 5 shows a step-down converter 500, which has two control loops. A main control loop 41, which regulates the output voltage of the step-down converter, and an auxiliary control loop 39, 40, which regulates the de-energization of the first and second power transistors. The output voltage of the step-down converter is regulated as a function of the activation duration of the first power transistor, and the number of oscillation periods of the node is regulated as a function of the supply voltage and the output current. For the de-energization of first power transistor 31, the activation duration of second power transistor 32 is regulated as a function of the supply voltage and of the output current of the step-down regulator. Level shifters 43, 45 and gate transistors 44, 46 for activating the particular power transistors 31, 32 are also shown.

In one exemplary embodiment, the two nodes 34, 35 may be monitored by the same detection unit. For an optimal switching of first and second power transistors 31, 32, the point in time at which nodes 34 and 35 have the maximum voltage or the supply voltage must be detected.

What is claimed is:

1. A device, comprising:
a first power transistor, a drain terminal of the first power transistor being connected to a supply voltage, and a source terminal of the first power transistor being connected to a first voltage potential and a second power transistor, a drain terminal of the second power transistor being connected to the drain terminal of the first power transistor and a source terminal of the second power transistor being connected to a second voltage potential, the first voltage potential being connected to a first monitoring unit and the second voltage potential being connected to a second monitoring unit, the first monitoring unit detecting the first voltage potential and the second monitoring unit detecting the second voltage potential, the first and second monitoring units comparing the first voltage potential and the second voltage potential to the value of the supply voltage and activate a control unit as a function of the comparisons, the control unit determining a switching point in time of the second power transistor; and
an arrangement which generates a current when the second power transistor is being switched on, the current changing the first voltage potential, and the control unit activates the first power transistor when the first voltage potential has the same value as the supply voltage, so that the first power transistor is de-energized.

2. The device as recited in claim 1, wherein the arrangement includes a capacitor and a coil, the capacitor being connected to the second voltage potential and to ground, and the coil being connected to the first voltage potential and the second voltage potential.

3. The device as recited in claim 1, wherein each of the first and second monitoring units each includes a comparator, which carries out the comparison of the first voltage potential and of the second voltage potential to the supply voltage.

4. The device as recited in claim 1, wherein the first and second monitoring units include an arrangement which determines a respective maximum of the first voltage potential and of the second voltage potential, and the control unit determines the switching point in time of the first power transistor and of the second power transistor as a function of the respective maximum.

5. The device as recited in claim 1, wherein the first monitoring unit and the second monitoring unit are implemented in a single monitoring unit that monitors both the first voltage potential and the second voltage potential.

6. A method for reducing switching losses of a device, comprising:
detecting a first voltage potential with the aid of a first monitoring unit;
detecting a second voltage potential with the aid of a second monitoring unit;
comparing the first voltage potential and the second voltage potential to a supply voltage;
activating a control unit;
determining a switching point in time of the second power transistor;

switching on a second power transistor;
reversing a charge of parasitic capacitances of the first power transistor; and
changing the first voltage potential at the source terminal of the first power transistor;
wherein the charge of the parasitic capacitances of the first power transistor being reversed with the aid of a current when the second power transistor is being switched on, so that the first voltage potential at the source terminal of the first power transistor is changed, and the first power transistor being activated by the control unit when the first voltage potential has the value of a supply voltage so that the first power transistor is de-energized.

7. The method as recited in claim 6, wherein a respective maximum of the first voltage potential and of the second voltage potential is determined with the aid of the first monitoring unit and the second monitoring unit, and the switching points in time of the first power transistor and of the second power transistor are determined as a function of the maxima with the aid of the control unit.

\* \* \* \* \*